US007067328B2

(12) United States Patent
Dubrow et al.

(10) Patent No.: US 7,067,328 B2
(45) Date of Patent: Jun. 27, 2006

(54) METHODS, DEVICES AND COMPOSITIONS FOR DEPOSITING AND ORIENTING NANOSTRUCTURES

(75) Inventors: Robert Dubrow, San Carlos, CA (US); Linda T. Romano, Sunnyvale, CA (US); David Stumbo, Belmont, CA (US)

(73) Assignee: Nanosys, Inc., Palo Alto, CA (US)

( * ) Notice: Subject to any disclaimer, the term of this patent is extended or adjusted under 35 U.S.C. 154(b) by 199 days.

(21) Appl. No.: 10/673,092

(22) Filed: Sep. 25, 2003

(65) Prior Publication Data

US 2005/0066883 A1 Mar. 31, 2005

(51) Int. Cl.
*H01L 21/00* (2006.01)
*H01L 21/31* (2006.01)

(52) U.S. Cl. ........................... 438/1; 438/765; 117/68; 977/762; 977/827

(58) Field of Classification Search .................... 438/1, 438/765, 758; 117/68; 977/762, 827
See application file for complete search history.

(56) References Cited

U.S. PATENT DOCUMENTS 5,505,928 A 4/1996 Alivisatos et al.
6,225,198 B1 5/2001 Alivisatos et al.
6,306,736 B1 10/2001 Alivisatos et al.
6,849,558 B1 * 2/2005 Schaper ...................... 438/758
6,866,801 B1 * 3/2005 Mau et al. ................. 264/29.1
2002/0179434 A1 12/2002 Dai et al.
2003/0089899 A1 5/2003 Leiber et al.
2003/0234465 A1 * 12/2003 Chen et al. ................. 264/108
2004/0005723 A1 1/2004 Empedocles et al.

FOREIGN PATENT DOCUMENTS

WO WO 02/017362 2/2002
WO WO 02/080280 10/2002

OTHER PUBLICATIONS

Greene et al. ("Low-temperature wafer scale production of ZnO nanowire arrays", Angew. Chem. Int. Ed. 42, 3031-3034, 2003).

* cited by examiner

*Primary Examiner*—Alexander Ghyka
(74) *Attorney, Agent, or Firm*—Quine Intellectual Property Law Group, P.C.; Andrew L. Filler

(57) ABSTRACT

Methods and systems for depositing nanomaterials onto a receiving substrate and optionally for depositing those materials in a desired orientation, that comprise providing nanomaterials on a transfer substrate and contacting the nanomaterials with an adherent material disposed upon a surface or portions of a surface of a receiving substrate. Orientation is optionally provided by moving the transfer and receiving substrates relative to each other during the transfer process.

30 Claims, 6 Drawing Sheets

314
310
304
312
308
302
306
300

METHODS, DEVICES AND COMPOSITIONS FOR DEPOSITING AND ORIENTING NANOSTRUCTURES

BACKGROUND OF THE INVENTION

Nanotechnology has been heralded as the next major technological leap, in that it is prophesied to yield a variety of substantial advantages in terms of material characteristics, including electronic, optical and structural characteristics. Some have predicted that advances in nanotechnology are the best hope for extending the lifespan of Moore's law.

While nanotechnology advances have produced materials with myriad interesting properties with broad potential applicability, the integration of these materials into useful devices, systems and materials has remained somewhat of a stumbling block when viewed from the perspective of commercial manufacturability. By way of example, carbon nanotubes, often viewed as the hallmark of nanomaterials, are largely unusable from a commercial standpoint as anything more than filler for composite materials, e.g., to impart structural, and perhaps crude electrical properties to the overall bulk composite. This is because these nanotubes often have unpredictable electrical properties from one nanotube to the next, requiring a sensitive selection process in order to be able to use them reproducibly for more exacting requirements, e.g., in electronics, etc.

Another difficulty that affects virtually all nanomaterials is the integration of these materials into devices and/or systems where placement of such materials is important, e.g., bridging electrical contacts, spanning gate electrodes, etc. In particular, these materials are so small that it is virtually impossible to accurately position them using manual manipulative techniques, particularly from a commercial manufacturing standpoint, e.g., in large quantities with high yields. A number of methods have been proposed and demonstrated for positioning of these materials using more manageable methods. For example, flow directed placement methods have been successfully utilized to direct and place semiconductor nanowires in desired locations, e.g., where solutions containing wires or nanotubes are flowed into contact with substrates to both align, via the flow, and place, via the contact regions, wires onto the substrate surface. Molecular recognition and self assembly techniques, e.g., using chemical groups on the desired locations of the substrates and complementary groups on the nanomaterials, have also been proposed and demonstrated for the placement of nanomaterials in desired locations of substrates. Despite the reported effectiveness of these methods in positioning nanomaterials, to date such methods have yielded widely disparate results, e.g., in the uniformity of the deposition, orientation and positioning of the materials. The lack of uniformity is very detrimental in a commercial manufacturing setting, particularly when applied to, e.g., the electronics industry where product to product variations must be virtually non-existent. These methods also suffer from manufacturing requirements that will require substantial infrastructure development as well as development of an "art" form in the performance of these techniques.

Accordingly, there exists a need for a robust, repeatable process for the positioning and/or orientation of nanomaterials on other substrate materials for use in, e.g., electronics, optoelectronic, optical and material applications. The present invention meets these and a variety of other needs.

BRIEF SUMMARY OF THE INVENTION

The present invention generally provides methods, compositions, systems and the like for positioning and optionally orienting or aligning nanostructures onto a surface of a substrate, typically for integration into a functional device or composition.

In particular, in a first general aspect, the invention provides a method of depositing nanomaterials onto a substrate. In accordance with the invention, a plurality of nanostructures are provided disposed upon a transfer substrate. An adherent material is provided deposited on selected regions of a receiving substrate. The transfer substrate is mated with the receiving substrate whereupon the nanostructures contact the nanostructures on the transfer substrate with the selected regions of the receiving substrate. When the transfer substrate is separated from the receiving substrate it leaves nanostructures adhered to the selected regions of the receiving substrate.

In a related aspect, the deposited nanostructures are substantially oriented during the deposition process by moving one or more of the transfer substrate and receiving substrate relative to the other of the transfer substrate and the receiving substrate to substantially orient the nanostructures along a common axis. The nanostructures are then separated from the transfer substrate after the moving step, to leave the plurality of nanostructures substantially oriented on the receiving substrate along the common axis.

The invention also provides articles that have a first substrate having an adherent material disposed upon its surface and a plurality of nanostructures disposed upon the adherent material, and optionally substantially oriented along a common axis. Similarly, the invention provides compositions that comprise a layer of polymeric adherent material with a plurality of substantially aligned nanowires adhered to a surface of the adherent layer.

A number of uses, applications and variations to the invention will be readily apparent from the following disclosure, and are generally encompassed within the invention.

DETAILED DESCRIPTION

The present invention is generally directed to devices, systems and methods for use in positioning and/or orienting nanomaterials, and particularly nanomaterials having high aspect ratios onto other substrate materials. In general terms, the invention involves the transfer of nanomaterials from a first substrate, also termed a "transfer substrate" to a second substrate upon which it is desired to position such nanomaterials, also termed a "receiving substrate." Thus, initially, the nanomaterials are provided upon a surface of the transfer substrate. The transfer is effected by providing an adherent material deposited upon a surface of the receiving substrate upon which the nanomaterials are desired to be deposited, positioned and/or oriented. The nanomaterials on the transfer substrate are then contacted with the adherent material on the receiving substrate to affix the nanomaterials onto the receiving substrate, by contacting the two substrate surfaces together.

Once the two substrates are separated, nanomaterials that contact the adherent material on the receiving substrate are lifted from the transfer substrate and transferred to those portions of the receiving substrate that include the adherent material. By controlling the location of the adherent material on the receiving substrate, one can effectively pattern or position the nanomaterials in desired regions of the receiving substrate, while leaving other regions of the receiving substrate clear of the nanomaterials. Further, by controlling the contacting and separating steps, one can also control, to a large extent, the orientation and/or configuration of the nanostructures thus deposited. As will be apparent from the following disclosure, a wide variety of variations, modifications and improvements upon the basic invention may be practiced.

Figure 1:
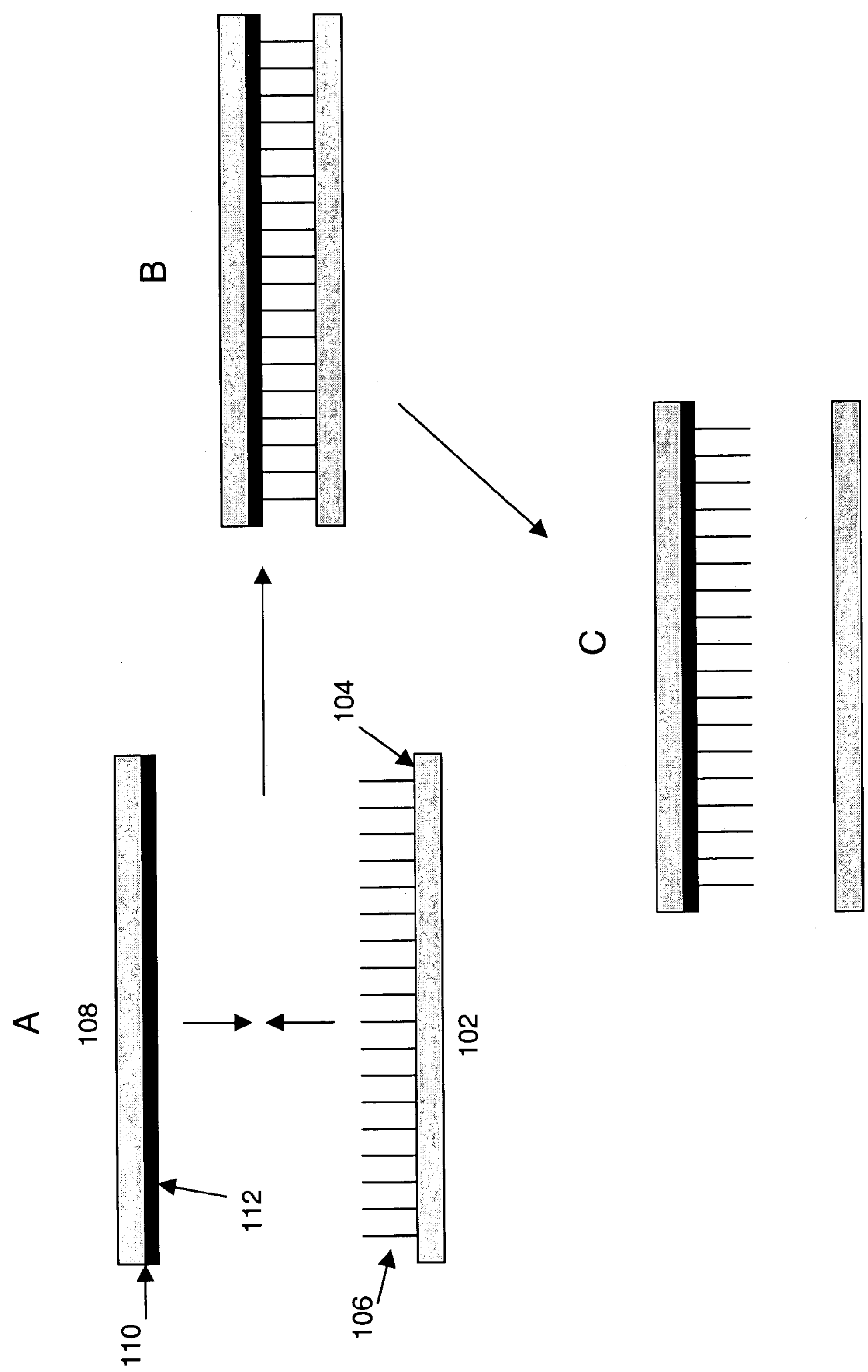
FIG. 1 is a schematic illustration of the nanostructure deposition processes of the invention.

FIG. 1 provides a schematic illustration of the processes employed in the present invention. As schematic representations, the illustrations are presented solely for the purpose of clarifying certain aspects of the invention and are not intended as "to scale" or detailed representations of any aspect of the invention, nor should they be viewed as providing any limitations on the invention. As shown in panel A, a first substrate, e.g., transfer substrate 102, is provided having nanostructures, e.g., nanowires 106, disposed on its surface 104. A second, or receiving substrate 108 is provided. Upon the surface 110 of the receiving substrate 108, where nanostructure deposition is desired, an adherent material or surface treatment 112, is provided. As shown in Panel B, the two substrates are brought together whereby the nanostructures 106 contact the adherent surface 112, on the receiving substrate 108, so that at least a portion of the nanostructures 106 adhere to the adherent surface 112 of the receiving substrate. Upon separation (See Panel C) of the two substrates, the nanowires 106 are transferred to the adherent surface 112 on the receiving substrate 108.

As described above, true nanomaterials, e.g., structural materials having at least one cross sectional dimension of less than 500 and preferably less than 100 nm, possess a wide variety of interesting properties, including electrical properties, optoelectronic properties, optical properties and structural properties. While certain of these properties can be exploited in bulk applications, e.g., the structural characteristics of nanomaterials incorporated into composites, a much larger number of useful applications require some measure of precision in the positioning, configuration and orientation of the nanomaterials. Issues relating to the configuration of the nanomaterials have been at least partially addressed through novel synthetic schemes whereby one can produce very well defined populations of zero and one dimensional nanomaterials. High aspect ratio nanomaterials, e.g., nanorods, nanowires and nanotubes, are particularly useful for a number of electronic and optoelectronic applications. For ease of discussion, all of these high aspect ratio nanomaterials are referred to generically herein as nanowires. Further, despite the primary focus on high aspect ratio nanomaterials, it will be appreciated that many aspects of the present invention are equally applicable to positioning of lower aspect ratio nanomaterials onto a receiving substrate, e.g., spherical or near spherical nanocrystals, e.g., quantum dots.

High aspect ratio semiconductor nanomaterials have particularly valuable properties when employed in electronic applications and particularly large area or "macroelectronic" applications. In particular, because semiconductor nanowires generally have a single crystal or near single crystal structure, they possess relatively high electron mobilities all along their length dimension that are generally on the same order as the mobilities found in single crystal silicon substrates. However, because they are free standing structures, they can be processed in a much more cost effective fashion than slabs of single crystal semiconductors, more like amorphous semiconductors (whose electron mobilities are too low for many applications). Similar to amorphous semiconductors, these nanorods and nanowires are also amenable to processes that yield flexible electronics. The use of nanomaterials, and particularly semiconductor nanowires in these applications has been described in substantial detail in, e.g., U.S. Provisional Patent Application Nos. 60/414,323 and 60/414,359, each filed Sep. 30, 2002, and 60/468,276, filed May 7, 2003, the full disclosures of which are hereby incorporated herein by reference in their entirety for all purposes.

Figure 2:
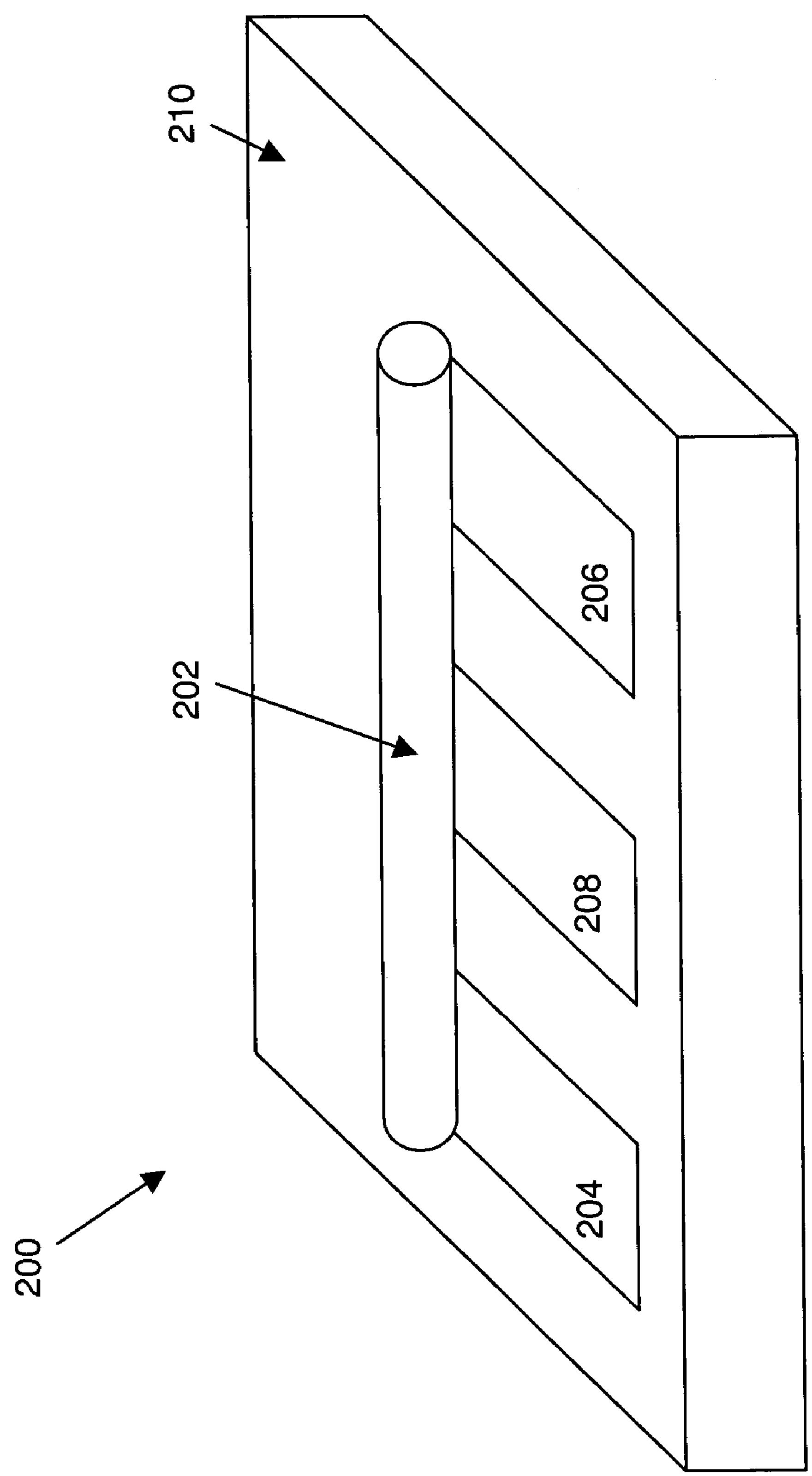
FIG. 2 is a schematic illustration of a nanowire based electronic device, e.g., a transistor.

In general, producing electronic components from nanowire materials, e.g., thin film transistors (TFTs) or the like, typically involves depositing the nanowires or nanorods onto a substrate material so that the nanowires make appropriate contact with other electrical components of the device that is being fabricated, e.g., providing a conductive path between source and drain electrodes. FIG. 2 schematically illustrates the use of nanowires as electronic components. In particular, shown is a simple nanowire transistor device 200 that includes a nanowire 202 that connects two electrodes, e.g., source electrode 204 and drain electrode 206, all disposed upon a base substrate 210. In the case of a field effect transistor, a gate electrode 208 is provided adjacent the nanowire to modulate the conductivity of the nanowire 202. Although illustrated and described as a transistor, it will be appreciated that a large variety of electrical devices may be produced that include the basic nanowire structure, including basic transistors, MOSFETS, MESFETS, intra and interwire diodes, etc. As will be appreciated, by orienting the nanowires during the deposition process, one can substantially improve the yield of the process used for fabricating devices, e.g., by ensuring all necessary contacts are made between electrodes.

Figure 3:
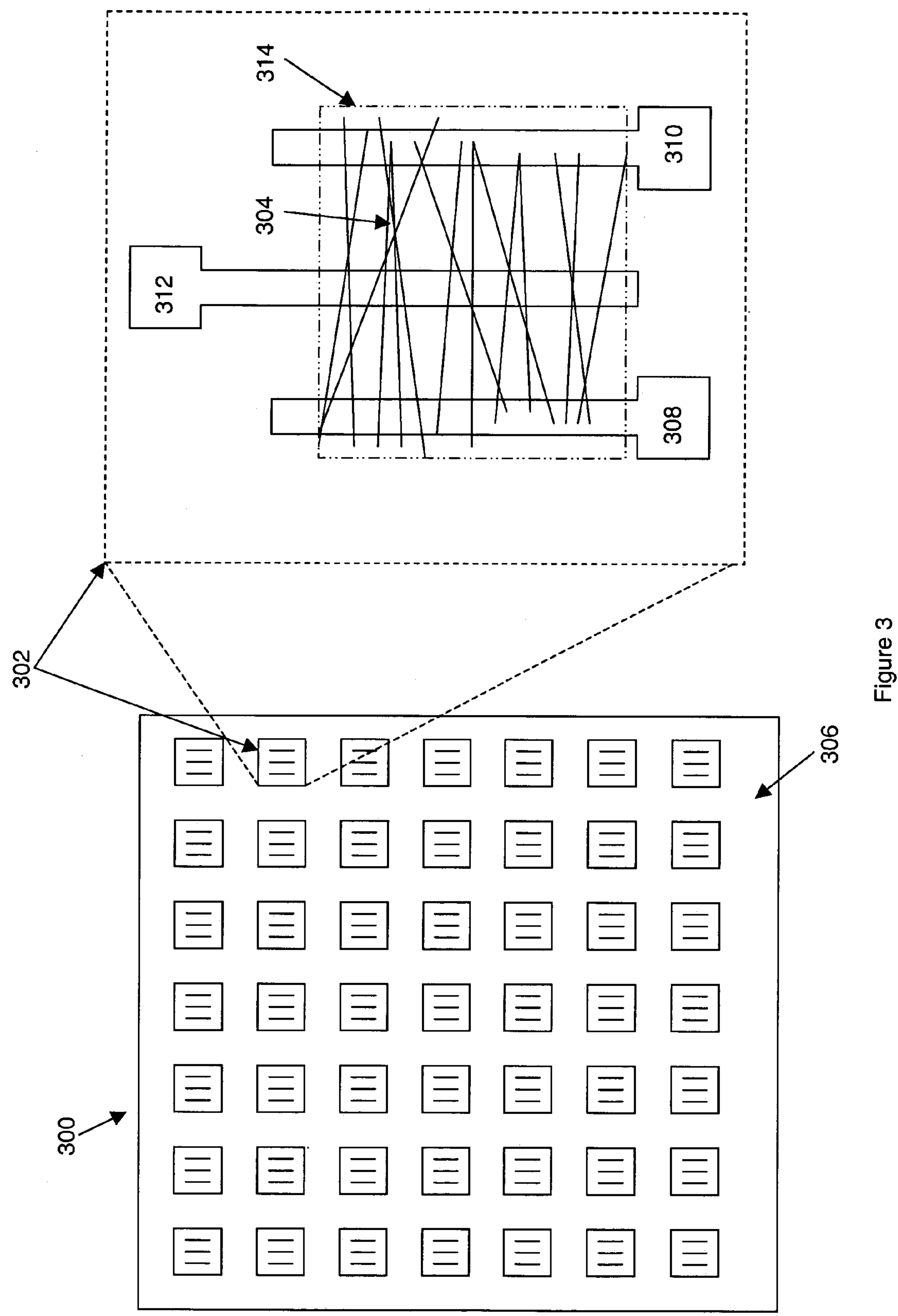
FIG. 3 is a schematic illustration of a transistor array and individual device made using oriented populations of nanowires as the conductive channel for the device.

In a modified application of the nanowire electronics shown in FIG. 2, large numbers of nanowires can be used, e.g., as a film, to provide electronics with enhanced properties, such as ease of fabrication of large area electronics, e.g., as illustrated in transistor array 300, and relatively high performance. In particular, as can be seen in panel A, a large area macroelectronic device, array or substrate, e.g., array 300, is produced using populations of nanowires disposed over the surface of the substrate or portions thereof. In this array, individual devices, e.g., transistor 302, can further take advantage of the high aspect ratio of these nanowire materials by including large numbers of oriented wires that substantially span the space between two or more electrodes. In particular, Panel B illustrates a simplified electronic circuit device from array 300, using large numbers of oriented nanowires 304 deposited upon a substrate surface 306 as the semiconductive channel between two electrodes, e.g., source electrode 308 and drain electrode 310. By so orienting these materials, one can effectively provide single crystal semiconductor electron mobilities between the electrodes, e.g., in individual wires, while providing sufficient current density (e.g., through multiple wires) with extremely low lateral electron mobilities, e.g. orthogonal to the direction from one electrode to another. Further, as noted above, the overall small scale of the individual nanowires in both length and width dimensions, allows for production of flexible overall electronic devices using simplified processing technologies. As shown, the transistor 302 also includes gate electrode 312. Fabrication, application and performance of devices like that schematically illustrated in panel B FIG. 3 are described in substantial detail in, e.g., U.S. patent application Ser. Nos. 60/414,323 and 60/414,359, each filed Sep. 30, 2002, 60/468,276, filed May 7, 2003, 60/493,005, filed Aug. 7, 2003, 60/445,421 filed Feb. 5, 2003, 60/474,065, filed May 29, 2003 and 60/488,801, filed Jul. 22, 2003, the full disclosures of which are hereby incorporated herein in their entirety for all purposes.

Typically, the nanowires employed in electronics applications are produced by growing or synthesizing these elongated structures on planar substrate surfaces. By way of example, Published U.S. patent application No. US-2003-0089899-A1 discloses methods of growing uniform populations of semiconductor nanowires from gold colloids adhered to a solid substrate using vapor phase epitaxy. Greene et al. ("Low-temperature wafer scale production of ZnO nanowire arrays", L. Greene, M. Law, J. Goldberger, F. Kim, J. Johnson, Y. Zhang, R. Saykally, P. Yang, Angew. Chem. Int. Ed. 42, 3031–3034, 2003) discloses an alternate method of synthesizing nanowires using a solution based, lower temperature wire growth process. A variety of other methods are used to synthesize other elongated nanomaterials, including the surfactant based synthetic methods disclosed in U.S. Pat. Nos. 5,505928, 6225,198 and 6,306,736, for producing shorter nanomaterials, and the known methods for producing carbon nanotubes, see, e.g., US-2002/0179434 to Dai et al. As noted herein, any or all of these different materials may be employed in the processes, devices and systems of the invention. For semiconductor applications, a wide variety of type III–V, II–VI and IV semiconductors may be utilized, depending upon the ultimate application of the device produced. In general, such semiconductor nanowires have been described in, e.g., US-2003-0089899-A1, incorporated herein above. Similarly, semiconductor nanorods and quantum dots have also been reported fabricated from any number of different type III–VI, III–V and IV semiconductors. In certain preferred embodiments, the nanowires are selected from a group consisting of: Si, Ge, Sn, Se, Te, B, Diamond, P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, (Cu, Ag)(Al, Ga, In, Tl, Fe)(S, Se, $Te)_2$, $Si_3N_4$, $Ge_3N_4$, $Al_2O_3$, (Al, Ga, $In)_2$(S, Se, $Te)_3$, $Al_2CO$, and an appropriate combination of two ore more such semiconductors.

In various aspects, the at least one semiconductor may optionally comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type is selected from a group consisting of: Si, Ge, Sn, S, Se and Te.

In addition to single crystal nanowires, in certain aspects, nanowire heterostructures may be employed in the invention, e.g., longitudinal or coaxial heterostructures, if the end application of the device dictates. Such coaxial and longitudinal heterostructured nanowires are described in detail in, e.g., Published International Patent Application No. WO 02/080280, which is incorporated herein by reference for all purposes.

While generally described in terms of inorganic semiconductor materials, it will be appreciated that the deposition and alignment techniques described herein, may be used to dseposite and/or orient any nanomaterial, and for purposes of the orientation aspects of the invention, any elongate nanomaterial, e.g., nanorods, carbon nanotubes, polymeric nanofibers, organic or inorganic nanofilaments, protein nanofibrils, etc.

In accordance with the present invention, the nanowires are provided disposed on a surface of a transfer substrate, and preferably, are adhered to the surface of the transfer substrate. For purposes of the invention, the transfer substrate may comprise the substrate upon which the nanowires are synthesized, e.g., using a colloid based method, or it may comprise a different substrate. For example, in a first aspect, the transfer substrate comprises the substrate upon which the nanowires are grown or synthesized. In particular, for a number of methods of producing nanowires, a particle or colloid, e.g., a gold colloid, is deposited on a substrate surface, and is used to seed the growth of semiconductor nanowires using vapor phase epitaxial growth. The resultant nanowires are tethered to the surface of the substrate by virtue of their having been synthesized upon it. For a discussion of such wire synthesis, see, e.g., US-2003-0089899-A1.

In alternative aspects, nanowires may be produced elsewhere from the transfer substrate and subsequently deposited upon the transfer substrate. For example, nanowires may be produced upon and harvested from a growth substrate. The free nanowires, e.g., typically disposed in a fluidic suspension for ease of handling, are then deposited upon a transfer substrate surface. Deposition of nanowires onto the surface of the transfer substrate may be accomplished by a number of means. For example, the fluid suspension of nanowires may be coated onto the surface using, e.g., spin coating methods, or they may simply be flowed over the surface, and subsequently fixed to the surface of the transfer substrate. Fixing of the nanowires to the surface of the transfer substrate may be accomplished by taking advantage of natural forces between the nanowires and the surface, e.g., Van der Waals forces, or by incorporating a functional layer on the surface of the substrate and/or wires to enhance adhesion, e.g., a chemical binding layer, i.e., polylysine, polybrene, a silane or other oxide coating on the surface, etc. For a discussion of adherents useful for affixing nanowires to the surface of a substrate, e.g., a transfer substrate, see, e.g., U.S. patent application Ser. No. 10/405,992, filed Apr. 1, 2003, and incorporated herein by reference in its entirety for all purposes.

Alternatively, one may use the same adherent materials described in detail below for affixing the nanowires to the receiving substrate, provided that they are appropriately formulated on the transfer and receiving substrates to permit transfer of the nanomaterials from the former to the latter.

As noted a transfer substrate may comprise virtually any material. For example, in the case of a transfer substrate upon which the nanowires are grown, the transfer substrate may comprise a solid, rigid substrate, e.g., a silicon wafer, glass plate, polymeric plate, ceramic plate, or the like. Alternatively, it may comprise a flexible material, e.g., a flexible foil, e.g., aluminum, gold or the like, or a flexible polymeric sheet, provided that the flexible material is compatible with the nanowire synthesis process. For instances where the transfer substrate is an intermediate substrate, e.g., a substrate upon which the nanowires are deposited after being fabricated, then such substrate can comprise virtually any suitable material, e.g., suitable of being manipulated in accordance with the ultimate process and suitable for receiving the nanowires and having them adhered thereto. In particularly preferred aspects, transfer substrates upon which the nanostructures are fabricated may comprise any suitable substrate material for such manufacture. For example, for nanowires or other structures produced by relatively high temperature CVD or other vapor phase synthetic methods, the substrate may include a solid silica or other semiconductor based substrate like silicon or glass, or any other substrate surfaces that are used in this method.

Alternatively, transfer substrates upon which pre-synthesized wires are deposited, may be comprised of any number of different materials, including those solid substrates described above, as well as more temperature or chemically sensitive substrates, such as polymer films, or other organic materials.

In some cases, the nanostructures may be pre-oriented on the transfer substrate so as to transfer the structures to the receiving substrate in a substantially aligned or oriented state, e.g., the structures on the receiving substrate are substantially oriented as described herein. Orientation of nanostructures on the transfer substrate may be accomplished by a number of methods. For example, the structures may be "combed" into alignment or orientation. Such combing may comprise contacting the structure bearing substrate with a physical structure, e.g., a straight edge or surface, that is dragged across the structures to shear align those structures. Alternatively, a fluid based method may be employed where fluid is flowed over the structure bearing surface to flow align the structures that are attached to that surface. In other aspects, the structures may be produced in a pre-aligned orientation. For example, aligned growth of nanowires has been previously described in, e.g., U.S. patent application Ser. No. 10/405,992, which is incorporated herein by reference in its entirety for all purposes. Further, while described in terms of aligning nanostructures on a transfer substrate, it will be appreciated that such alignment may be applied to the nanostructures on the receiving substrate, post transfer.

In addition to simply transferring nanowires from a transfer substrate to a receiving substrate, the present invention also provides in certain aspects for specific positioning and/or alignment of the wires that are transferred onto the receiving substrate. For example, by providing the adherent material or surface treatment to selected portions of an overall substrate, one can select precisely where nanostructures, e.g., nanowires will be transferred/disposed upon that substrate. For example, with reference to FIG. 3, one can position the nanowires on selected portions of the overall receiving substrate surface 306, by providing adherent material patterned onto the substrate in only selected regions, e.g., region 314 (as shown by the staggered outline box). Patterning of the adherent surface is readily accomplished by any number of conventionally available technologies. For example, selected regions may be coated with adherent materials using physical masking methods, or may be patterned from photoresists using conventional photolithography techniques.

In general, the invention affects alignment of transferred nanowires by shifting the transfer substrate or receiving substrate relative to the other while the nanowires are contacting and adhered to the surface of the receiving substrate but not yet separated from the transfer substrate. In particular, once the transfer substrate having the nanowires disposed thereon is contacted with the receiving substrate surface bearing the adherent material, one of the transfer substrate or receiving substrate is moved relative to the other to align the nanowires in the direction of that movement, e.g., by pulling the wires into alignment. When the substrates are separated, the deposited nanowires are disposed in a substantially aligned orientation.

By "substantially aligned orientation" means that a majority of the nanostructures in a population of nanostructures is predominantly oriented substantially along a given axis, which means that the alignment of such structures in the majority of the population have an orientation that does not vary from the given axis by more than 30 degrees, preferably not more than 20 degrees, and in many cases varies less than 10 degrees or even 5 degrees from the given axis.

Typically, the relative movement of one substrate to another is in the range of the length of the average nanowires being deposited and aligned, and typically less. As such, the substrates will typically be moved relative to each other by up to 5 mm (from the position of initial contact). In many cases, smaller movements may be made, e.g., shifting the substrates relative to each pother by no more than 1 mm, 100 μm, 10 μm or 1 μm or even less than 1 μm. In some cases, higher deposited nanowire or nanostructure densities may be accomplished by providing greater drag distances over a substrate, or by repeating shorter dragging steps, interspersed with separation and re-contacting steps, to deposit more nanowires or other nanostructures in a single location.

In general, instrumentation is readily available to perform the manipulation operations described herein, including precision translation stages, micromanipulators, etc. In the case of roll to roll transfer movement of one substrate relative to the other may be affected by varying the speeds of one substrate roll relative to the other, e.g., moving one substrate slightly slower than the other, so that nanowires contacting the receiving substrate are pulled into alignment in the direction of the differential speed.

Figure 4:
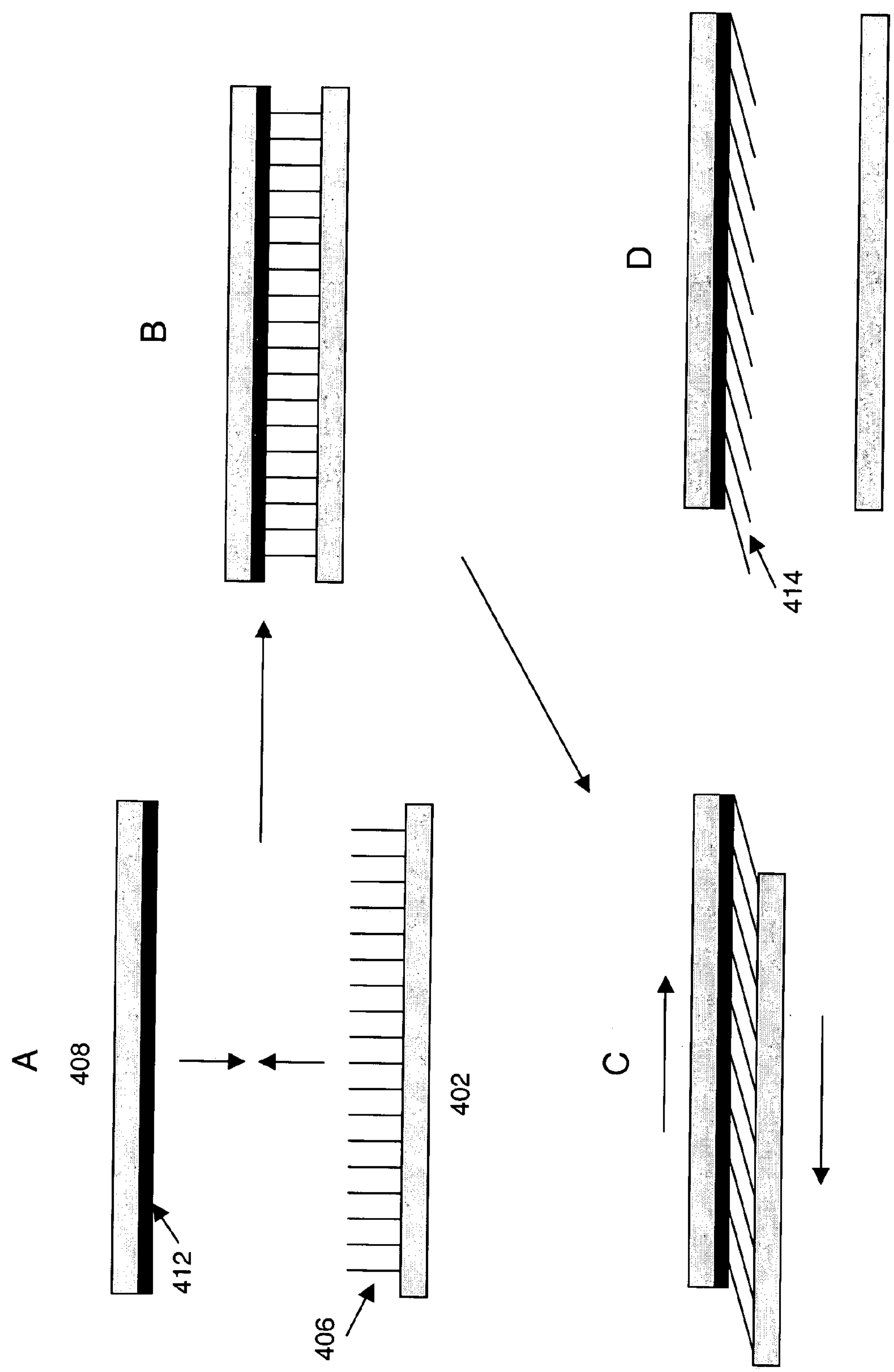
FIG. 4 is a schematic illustration of the nanostructure deposition and alignment/orientation methods of the invention.

FIG. 4 schematically illustrates the combined transfer and alignment processes of the invention. Briefly, the transfer substrate 402 bearing the nanowires 406 is contacted with the adherent surface 412 (See panels A and B) of the receiving substrate 408, whereupon the wires are adhered to that surface (see panel B). Prior to separating the two substrates, one or both of the transfer 402 and receiving 408 substrates is moved relative to the other, e.g., as shown by the arrows in panel C, to pull the wires into alignment in the direction of relative movement. Following such alignment, the substrates are separated to leave substantially aligned nanowires 414 disposed on the surface of the receiving substrate 408. Again, although the foregoing processes are described in terms of depositing aligned nanostructures on a receiving substrate, it will be appreciated that the such a receiving substrate in certain cases, may be used as a transfer substrate, e.g., one may use the alignment and deposition processes described above to provide for pre-alignment of the nanostructures for a subsequent transfer step, e.g., to transfer pre-aligned or oriented nanostructures to an additional receiving substrate.

In the case of an intermediate transfer substrate, e.g., where a transfer substrate is other than, it may be desirable to treat such an intermediate substrate so as to enable easy removal of the nanostructures from the transfer substrate e.g., to transfer them to the receiving substrate. By way of example, the transfer substrate surface may be chemically treated to provide poorer adhesion to the nanostructures than the receiving substrate, thus providing easy transfer. Examples of such treatments include, e.g., coatings of non-stick materials, e.g., Teflon or other organic coating materials. Similarly, chemical treatments may be provided that provide an activated release, e.g., a photo, chemical or thermally cleavable chemical linker group that binds the nanostructure to the transfer substrate. Upon contact with the receiving substrate (or prior to such contact), the activatable group is activated to release the nanostructures and allow easy transfer. Other reversible linking or coupling techniques might also be employed for coupling nanostructures to a transfer substrate, including, e.g., using electrostatic, or magnetic forces to maintain the nanostructures on the transfer substrate until the transfer is desired.

As with the transfer substrate, the receiving substrate, too, may be comprised of virtually any material that suits the needs of the ultimate application of the devices fabricated therefrom. For example, certain applications may require rigid substrates that have a high degree of tolerance to extremes of heat, chemical agents or the like. In still other applications, the ultimate device may benefit from being flexible, transparent, thin or from having a number of other characteristics that may be imparted by the underlying substrate, e.g., low cost, or low glass transition temperature (Tg). For antenna applications, for example, materials with good RF performance characteristics will be preferred, e.g., high or controlled dielectric constants, low loss, well controlled thickness, etc. Similar characteristics may be useful for stacked or layered circuits or for mass produced electronic components, e.g., RFID tags, which might also benefit from the ability to selectively and differentially provide base substrates for each layer, in order to capitalize on substrate characteristics for each layer, separately.

Figure 5:
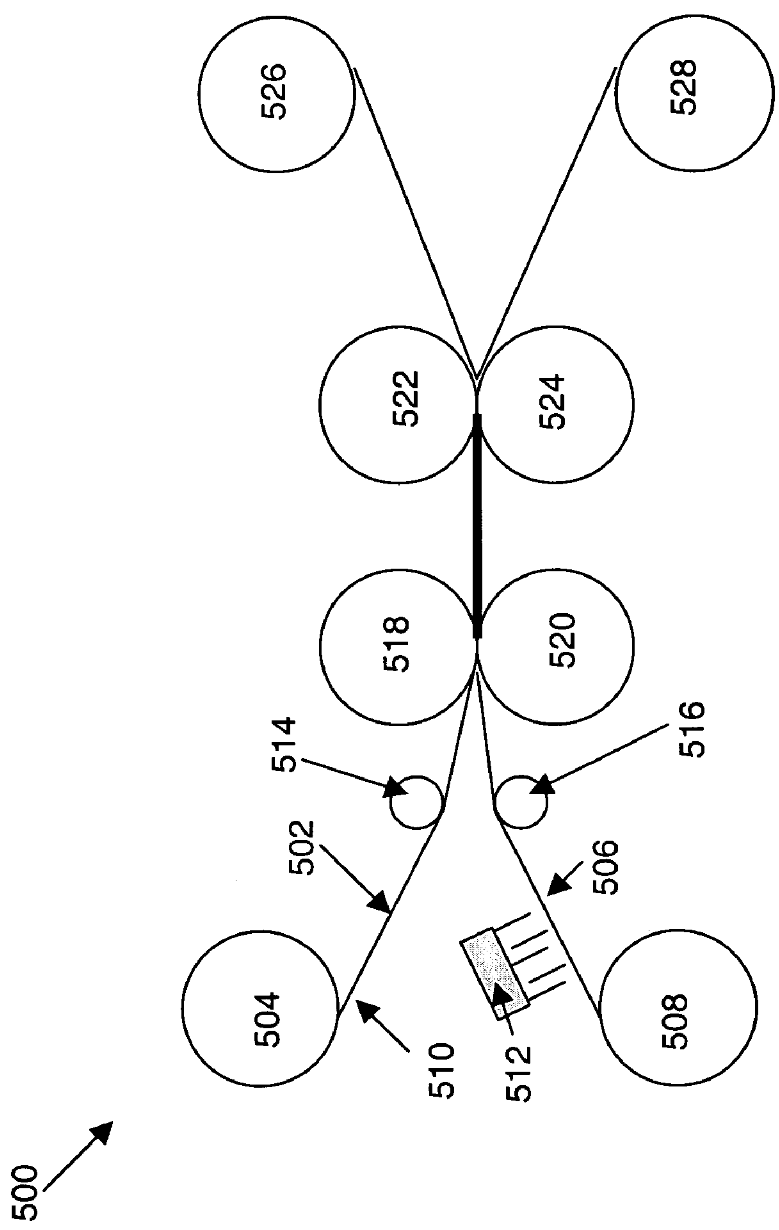
FIG. 5 is a schematic illustration of a roll-roll process for producing nanowire substrates in relatively high volume.

In certain preferred aspects, the transfer substrate is a flexible substrate that is provided as either a flat sheet, or a sheet that is wound into a roll. By providing the transfer substrate as a roll or sheet, one can readily employ commercial roll to roll, or laminate type processes in depositing nanowires onto the receiving substrate. Similarly, the receiving substrate is preferably provided as a flexible material, sheet or substrate, that can be used as a base substrate for the end application, e.g., as a flexible macroelectronic substrate. By way of example, FIG. 5 schematically illustrates a process and associated equipment 500 for depositing and or orienting nanostructures on a receiving substrate surface using a roll-to-roll process. In particular, a transfer substrate 502 is provided rolled onto an appropriate drum or roller 504. Similarly, a receiving substrate 506 is provided upon a second drum or roller 508. The transfer substrate includes nanostructures disposed upon its surface 510. The receiving substrate surface may be pretreated with an adherent material or treatment or such adherent material may be applied once the receiving substrate is un-rolled from the drum, but before it is contacted with the transfer substrate, e.g., by applicator 512. Applicator 512, may comprise a spray applicator, a vapor phase applicator, a knife applicator, or the like, depending upon the nature of the adherent material used and the desired thickness and/or uniformity of the adherent material coating. Alternatively, in certain preferred aspects, applicator 512 is used to apply an activator to a predisposed material on the surface of the receiving substrate 506. For example, the applicator may apply an activation energy to activate chemical groups on the surface to provide the adherent surface. Alternatively, the receiving substrate may be provided with a coating of material, e.g., a photoresist polymer, that can be made adherent through exposure to light or solvents, e.g., acetone. Such treatments are described in greater detail herein.

Following any application and/or activation of an adherent surface on the receiving substrate, the transfer substrate sheet and receiving substrate sheets are passed through feed rollers 514 and 516 and into drum presses 518, 520 and optionally 522 and 524, whereupon the surface of the transfer substrate bearing the nanowires is pressed into contact with the adherent surface on the receiving substrate. The pressure applied between the roll presses typically depends upon the nature of the nanostructures, the adherent material. Additionally, in some cases, other elements may be applied to the contacting step, including, e.g., application of heat etc. Following the contacting of the two substrate sheets, the laminated sheets are separated into their constituent sheets with some portion of the nanowires on the transfer substrate surface 510 being transferred in whole or in part to the surface of the receiving substrate 506. The spent roll of transfer substrate and newly deposited receiving substrate are then moved to subsequent processing steps, e.g., rolled onto take-up drums 526 and 528, respectively.

In the case where it is desired to simultaneously deposit and orient the nanostructures on the adherent surface of the receiving substrate, the process may be slightly modified by simply moving the transfer substrate roller drums, e.g., feed drum and take-up drum 504 and 526, respectively, at slightly higher or lower speeds from the corresponding feed and take up drums for the receiving substrate, e.g., drums 508 and 528, respectively. The result is that during the contact step, one substrate will move faster than the other, causing a stretch or pull alignment of the nanowires disposed between the two substrate's surfaces in the direction of the differential substrate velocity while the wires are coupled to both substrates.

A wide variety of different materials may be employed as the adherent material on the surface of the receiving substrate. By way of non-limiting examples, such adherent materials may comprise materials that are coated onto the surface of the receiving substrate, such as thin films of e.g., adherent polymers, or they may comprise surface treatments that are applied to the surface of the receiving or other substrate to render that surface appropriately adherent. In still further alternate aspects, the adherent material may comprise a surface derivatization applied to the receiving or other substrate surface to provide for adherence, e.g., coupling chemical functional groups directly to the surface moieties of the receiving or other substrate, so as to provide adherent characteristics. Finally, in some cases, the surface of the receiving or other substrate may, in its existing form, e.g., without any modification, provide adherent characteristics.

As noted above, in preferred aspects, polymeric adherent materials are employed in the invention and are generally applied to the surface of the receiving or other substrate as a thin film. Application of thin polymer films can be accomplished by any of a variety of known methods, including, e.g., spin coating, dip coating, spray coating, lamination, in situ polymerization, etc.

Virtually any polymer adhesive, e.g., contact or pressure sensitive adhesives, can be applied to the invention depending upon the nature of the application to which the ultimate device or article is to be put. However, in certain preferred aspects, polymers that are resist materials, e.g., photoresists, are employed as the adherent layer, due to their ability to be readily patterned onto substrates for selective deposition of adherent regions, and for their ability to have their adherent characteristics modified by optical or chemical means. Examples of commercially available photoresists that are well suited for these applications include, e.g., Shipley S1800, S1813, SPR 220, STR 1000, SPR 3000, SPR 3600, SPR 500, SPR 955-CM, Microchem Su-8 and Su8 2000, PMMA, HD Microsystems HD 4000, 4001 and 4010, Clariant AZ1518, AZ4400 and AZ4620, and Dow Cyclotene resists In alternative aspects, other polymer adhesives may be used as the adherent material, and may be readily provided on the surface of the receiving substrate. In the case of patterned adherent layers, spin coating methods, inkjet printing methods, screen printing methods or vapor or spray deposition over a physical mask may be used to selectively apply adhesives in desired regions on the surface of the receiving substrate. Additionally or alternatively, with respect to the photomask, such adhesives may additionally be UV or otherwise photocurable, which can allow for ready photopatterning of the adhesive using a photomask or other photoexposure system, e.g., laser writing, etc. Such adhesives include a wide variety of adhesive materials that are readily available from, e.g., 3M, Dow Chemical Corp, Rad-Cure, and the like.

In addition to composite or polymer adhesive materials, the adherent material on the surface of the receiving substrate may alternatively comprise a modification of the receiving or other substrate surface, e.g., a rendering the surface soft or "sticky", by virtue of e.g., softening the surface or attaching chemical groups or derivatizing the surface to be more adherent coupling chemical moieties to the substrate surface that specifically or nonspecifically bind or otherwise associate with the nanostructures that are brought into contact or close proximity therewith (for purposes of the present invention, contact between the nanostructures and an adherent material includes bringing such materials into sufficiently close proximity for the nanostructures to bind with or otherwise adherently associate with such moieties, so as to enable adhesion of the structures onto the receiving substrate. Thus, although the adherent material is generally described as a separate layer of material from the receiving substrate, it will be appreciated that the receiving substrate may be comprised entirely or substantially of the material that functions as the adherent material. For example, a polymer sheet for use as the receiving substrate may have an adherent surface, either naturally, or by virtue of chemical, optical or thermal treatment. In at least one example, a photoresist material, e.g., polymethylmethacrylate, (PMMA) may be partially softened at the surface, either chemically, through light exposure or by elevating the temperature at the surface to above the glass transition temperature of the polymer, yielding an adherent surface layer of PMMA on an underlying rigid PMMA receiving substrate.

For solvent treatment, in some cases, it may be useful to use a solvent in a vapor phase, so as to be able to better control the solvent application and facilitate only partially softening of the resist layer (whether it is simply a layer on the substrate or the entire receiving or other substrate). Solvent/polymer combinations are readily known to those of ordinary skill in the art. For example, for a wide variety of polymeric materials, ethyl lactate and ethyl pyruvate are particularly useful solvents. Similarly, other organic solvents, such as acetone may generally be used, particularly where it is desirable to avoid any impact of the solvent on any underlying silicon or silicon oxide materials, e.g., wires or substrates.

Similarly, where the receiving substrate is comprised of a material with a natural adherent property toward the nanostructures, the surface of the receiving substrate may, without modification, provide the adherent material. For example, in the case of silica based nanostructures, e.g., silicon nanowires, many planar substrates will naturally adhere to the nanowire structures by virtue of Van der Waals interactions. For example a glass receiving substrate will naturally adhere to nanowires contacted therewith with very strong adhesion. In accordance with the invention, this surface property is included as the adherent material. The adhesion of nanowire surfaces to other planar surfaces, including glass and other materials, is described in detail in U.S. Provisional Patent Application No. 60/463,766, filed Apr. 17, 2003, which is incorporated herein by reference, in its entirety for all purposes.

In addition to merely depositing nanomaterials onto receiving substrates, the processes, systems and compositions described herein are also useful in depositing substantially oriented nanostructures. As used herein, the term "substantially oriented" refers to population or subpopulation of nanostructures that include at least one longer or major axis, e.g., the length, that are oriented or aligned so that their individual major axes are disposed substantially parallel to a common axis, meaning that at least 50% of the nanostructures in a population are disposed with their major axes disposed within 30° of a common axis, preferably, at least 60% , more preferably, at least 80% and still more preferably, at least 90% of the nanocrystals are aligned to within 30° of the common axis, preferably, within at least 10° of the common axis and more preferably, at least 5° of the common axis.

Substantial alignment of nanostructures in accordance with the invention, is generally carried out by a "stick and drag" method or a derivation thereof. In particular, as with the depositing methods described above, a nanostructure bearing transfer substrate is contacted with an adherent layer or material on the surface of a receiving substrate to adhere the nanostructures to the receiving substrate. However, instead of merely separating the transfer substrate from the nanostructures, the transfer substrate and/or the receiving substrate are moved relative to one another while the nanostructures are effectively coupled to both. As a result, the nanostructures are typically pulled into alignment in the direction of motion. As will be appreciated, the effectiveness of the alignment process is increased where the majority of the nanostructures are attached during the process at or near either of the opposing ends of the nanostructure along the major axis, e.g., nanowires or rods that are attached at one end and extend normally from the transfer substrate such that the opposing end contacts the adherent portion of the receiving substrate. However, in accordance with the invention, a desired level of alignment may also be accomplished with nanostructures that are more randomly arranged on the transfer substrate, provided that post deposition and alignment sufficient nanostructures are substantially oriented along the common axis, as defined herein.

Once deposited and oriented upon the receiving substrate, the oriented population of nanowires may be subject to additional processing for use in an ultimate application. For example, the adherent material may be removed from the receiving substrate to leave oriented deposited wires on the receiving substrate. Typically, the adherent material may be removed by a number of different processes, but will still generally leave the deposited nanowires in the same position and orientation. By way of example, particularly where organic adherent materials are used, the receiving substrate may be cleaned of the adherent material following wire deposition using conventional plasma cleaning techniques that are regularly employed in the semiconductor industry. Plasma or other vapor based cleaning based methods are preferred in a number of cases due to their ability to remove the adherent material without physically disturbing the nanowires adhered thereto.

In alternative aspects, the adherent material may be removed using solvent based methods. For example, where a photoresist is employed as the adherent material, following deposition of nanowires onto the adherent material, the adherent material may be exposed to light to render it soluble in an appropriate developer solution. Useful photoresists/developer solution combinations are well known in the semiconductor industry and are generally readily commercially available from, e.g., Dow, MicroChem, Shipley and the like. In other embodiments, acetone, chlorobenzene, propylene glycolmonomethyl ether acetate (PGMEA), ethyl lactate, ethyl or methyl cellosolve acetate, diglyme, or other industrial solvents in which the adherent material is readily soluble may be used to remove the adherent material from the receiving substrate. Further processes may be employed to remove any residual materials, e.g., using isopropanol following acetone treatment, for certain applications.

Alternatively, the adherent material may be converted to a non-adherent state, e.g., a photoresist may be soft or hard baked or otherwise cured. Additional layers may be deposited over the nanostructures and/or additional operational components may be applied to the receiving substrate, e.g., oxide layers or other insulators, metal traces or patterning from electrodes, e.g., source, drain and gate, etc. Additional nanostructures, e.g., deposited and/or oriented may also be applied over a layer of oriented deposited structures, by either taking advantage of the existing adherent material or by applying an additional adherent material over the first layer of nanostructures. Such structures may be used as, e.g., diodes, junctions or the like, by applying different layers of nanostructures, each comprised of a different material, in such a way. Using such dual deposition and/or orientation methods, one can create a variety of heterogeneous nanostructure containing devices or systems, wherein separate homogeneous layers are present.

Examples of additional processing steps include metal deposition over all or portions of aligned populations of nanowires, e.g., to form source, drain and/or gate electrodes for nanowire based transistors, diodes, etc. Insulating layers may be integral to the deposited nanowires or they may be separately deposited over nanowires. A variety of other uses and processes for these nanowire populations are described in, e.g., WO 02/080280, WO 02/17362, and U.S. Ser. No. 60/414,359, filed Sep. 30, 2002, and U.S. Ser. No. 60/474,065, filed May 29, 2003, the disclosures of which are hereby incorporated herein by reference in their entirety for all purposes.

EXAMPLES

The methods described herein were employed in depositing nanowires onto a substrate in a substantially aligned orientation. In particular, a 4" silicon wafer was used as the receiving substrate and patterned with a solution of a pressure sensitive adhesive (PolySciences 534028 in 30% isopropanol) with spots of adhesive that measured approximately 50 μm in diameter. Spotting was carried out using a standard XYZ robot and pipettor. Once deposited, the spots were dried at 60° C. to form adhesive pads about 10 μm thick on the surface of the wafer.

The transfer substrate was prepared on another 4" silicon wafer using the standard gold colloid based CVD growth process as generally described by Lieber et al. (See, e.g., US 2003-0089899-A1). The resultant transfer wafer possessed a covering of nanowires that each generally measured approximately 40 nm in diameter and 40 μm in length (as approximated from SEM inspection).

The wire surface of the transfer wafer was set down upon the adhesive pad bearing surface of the receiving wafer substrate such that the nanowires contacted the adhesive pads, without any additional applied pressure. The receiving and transfer wafers were then sheared in opposite directions an aggregate distance of 1 mm and the wafers were separated.

Figure 6:
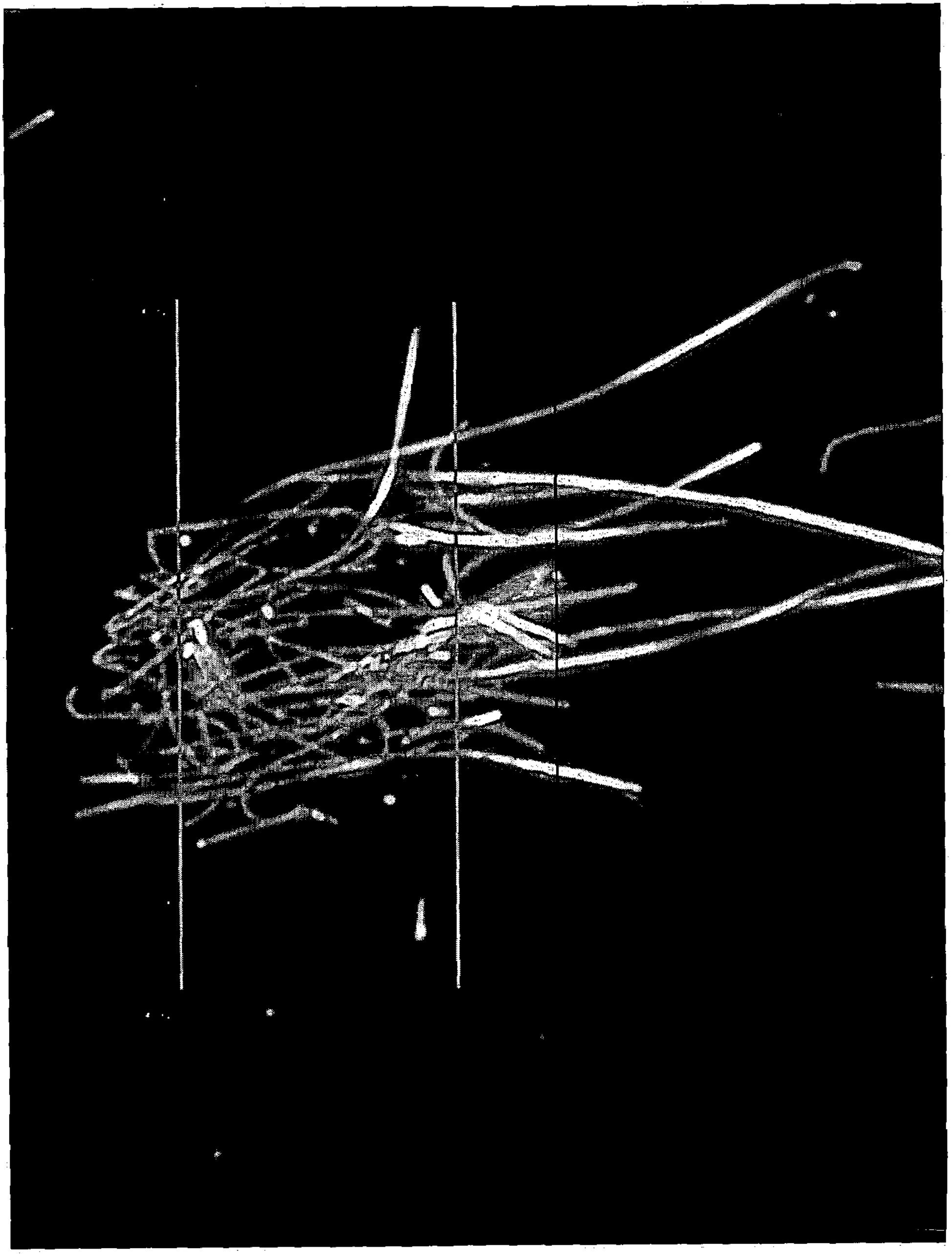
FIG. 6 is a SEM image of semiconductor nanowires deposited and oriented on a silicon wafer substrate in accordance with the invention.

The receiving substrate was then placed into a plasma cleaner to remove any organic material on the substrate, including any adhesive. Once cleaned, the receiving substrate was then analyzed by SEM. FIG. 6 is an image from the SEM of oriented nanowires remaining fixed in the location of a removed adhesive pad following cleaning.

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A method of depositing nanomaterials onto a substrate, comprising:

providing a plurality of nanostructures disposed upon a transfer substrate wherein the transfer substrate is disposed on a roll;

providing an adherent material deposited on one or more selected regions of a receiving substrate;

mating the transfer substrate with the receiving substrate whereupon the nanostructures contact the nanostructures on the transfer substrate with the one or more selected regions of the receiving substrate; and separating the transfer substrate from the receiving substrate to leave a population of nanostructures adhered to the one or more selected regions of the receiving substrate.

2. The method of claim 1, wherein the plurality of nanostructures comprises a plurality of nanofibers.

3. The method of claim 2, wherein the plurality of nanofibers comprises a plurality of semiconductor nanowires.

4. The method of claim 3, wherein the plurality of semiconductor nanowires comprise a semiconductor material selected from a Group II–VI semiconductor, a Group III–V semiconductor, or a Group IV semiconductor.

5. The method of claim 1, wherein the nanostructures are synthesized on the transfer substrate.

6. The method of claim 1, wherein the nanostructures are deposited upon the transfer substrate.

7. The method of claim 1, wherein the mating step comprises pressing the transfer substrate to the selected regions of the receiving substrate.

8. The method of claim 1, wherein the transfer substrate comprises a flexible planar sheet substrate.

9. The method of claim 1, wherein the roll of the transfer substrate is rolled over the receiving substrate.

10. The method of claim 1, wherein the receiving substrate comprises a flexible planar sheet substrate.

11. The method of claim 10, wherein the receiving substrate is disposed on a roll.

12. A method of depositing nanomaterials onto a substrate, comprising:

providing a plurality of nanostructures disposed upon a transfer substrate;

providing an adherent material deposited on one or more selected regions of a receiving substrate;

mating the transfer substrate with the receiving substrate; and separating the transfer substrate from the receiving substrate to leave a population of nanostructures adhered to the one or more selected regions of the receiving substrate;

wherein between the mating step and the separating step, at least one of the transfer substrate and the receiving substrate are moved in a direction substantially parallel relative to the other of the transfer substrate and the receiving substrate, to substantially align the nanostructures adhered to the receiving substrate.

13. The method of claim 12, wherein at least 50% of nanostructures in the population of nanostructures adhered to the one or more selected regions of the receiving substrate are aligned to within less than 30° of a common axis.

14. The method of claim 12, wherein at least 50% of nanostructures in the population of nanostructures adhered to the receiving substrate are aligned to within less than 10° of a common axis.

15. The method of claim 12, wherein at least 50% of nanostructures in the population of nanostructures adhered to the receiving substrate are aligned to within less than 5° of a common axis.

16. The method of claim 12, wherein at least 80% of nanostructures in the population of nanostructures adhered to the one or more selected regions of the receiving substrate are aligned to within less than 30° of a common axis.

17. The method of claim 12, wherein at least 80% of nanostructures in the population of nanostructures adhered to the one or more selected regions of the receiving substrate are aligned to within less than 10° of a common axis.

18. The method of claim 12, wherein at least 90% of nanostructures in the population of nanostructures adhered to the one or more selected regions of the receiving substrate are aligned to within less than 30° of a common axis.

19. The method of claim 12, wherein at least 90% of nanostructures in the population of nanostructures adhered to the receiving substrate are aligned to within less than 10° of a common axis.

20. The method of claim 1, wherein following the separating step, the adherent material is removed from the surface of the receiving substrate.

21. The method of claim 20, wherein the removing step comprises plasma cleaning of the receiving substrate.

22. The method of claim 20, wherein the removing step comprises cleaning the surface of the receiving substrate with a solvent.

23. The method of claim 20, wherein the adherent material comprises a photoresist, and the removing step comprises exposing the adherent material to light and contacting the adherent material with a developer solution.

24. A method of depositing a plurality of substantially oriented nanostructures on a substrate, comprising:

providing a transfer substrate having a plurality of nanostructures deposited thereon, each of the plurality of nanostructures having a major axis;

providing a receiving substrate having a surface comprising an adherent material;

bringing the nanostructures on the surface of the transfer substrate into contact with the adherent material on the surface of the receiving substrate whereupon the nanostructures adhere to the adherent material;

moving one or more of the transfer substrate and receiving substrate relative to the other of the transfer substrate and the receiving substrate to substantially orient the nanostructures along a common axis; and separating the nanostructures from the transfer substrate after the moving step, to leave the plurality of nanostructures substantially oriented on the receiving substrate along the common axis.

25. The method of claim 24, wherein a majority of the nanostructures are deposited on the transfer substrate with the major axis being substantially normal to a plane of the surface of the nanostructures on the transfer substrate.

26. The method of claim 12, wherein the plurality of nanostructures comprises a plurality of nanofibers.

27. The method of claim 26, wherein the plurality of nanofibers comprises a plurality of semiconductor nanowires.

28. The method of claim 27, wherein the plurality of semiconductor nanowires comprise a semiconductor material selected from a Group II–VI semiconductor, a Group III–V semiconductor, or a Group IV semiconductor.

29. The method of claim 12, wherein the nanostructures are synthesized on the transfer substrate.

30. The method of claim 12, wherein the nanostructures are deposited upon the transfer substrate.

* * * * *